United States Patent [19]

Arnold et al.

[11] Patent Number: 4,910,122
[45] Date of Patent: Mar. 20, 1990

[54] ANTI-REFLECTIVE COATING

[75] Inventors: John W. Arnold; Terry L. Brewer; Sumalee Punyakumleard, all of Rolla, Mo.

[73] Assignee: Brewer Science, Inc., Rolla, Mo.

[21] Appl. No.: 638,258

[22] Filed: Aug. 6, 1984

Related U.S. Application Data

[62] Division of Ser. No. 431,798, Sep. 30, 1982, abandoned.

[51] Int. Cl.$^4$ .............................................. G03C 5/00
[52] U.S. Cl. .................................... 430/313; 430/299; 430/317; 430/327; 430/329; 430/318
[58] Field of Search ............... 430/271, 311, 312, 313, 430/319, 299, 317, 327, 329, 318

[56] References Cited

U.S. PATENT DOCUMENTS

| | | |
|---|---|---|
| 4,102,683 | 7/1978 | DiPiazza . |
| 4,357,416 | 11/1982 | Fan ....................................... 430/302 |
| 4,362,809 | 12/1982 | Chen et al. ........................... 430/312 |
| 4,370,405 | 1/1983 | O'Toole et al. ...................... 430/312 |
| 4,376,162 | 3/1983 | Kawata et al. ....................... 430/510 |

OTHER PUBLICATIONS

Chang et al., "An Ideal Projection Photolithography", 1981 Symposium on VLSI Technology, Digest of Technical Papers, Maui, HI, Sep. 1981.
Kodak, '80 Interface, Oct. 1980, pp. 109–113 (Carlson).
Hackh's Chemical Dictionary, Third Edition, 1944, pp. 132, and 230.
IEEE Transactions on Electronic Devices, Ed. 28, No. 11, Nov. 1981, pp. 1405–1410 (O'Toole).
Journal of Applied Photographic Engineering, vol. 7, No. 6, Dec. 1981, pp. 184–186 (Brewer).

Primary Examiner—Jose G. Dees
Attorney, Agent, or Firm—Cohn, Powell & Hind

[57] ABSTRACT

A light absorbing medium to be interposed under photosensitive layers, such as a photo-resist for integrated circuit "chips" to eliminate defects caused by reflected light, has a polymer vehicle which can penetrate into small depressions of a substrate and form a thin, smooth and uniform coating. The coating includes a light absorbing dye. This light absorbing layer is imageable in the process. The light absorbing material eliminates many of the defects caused by reflected light resulting in increased sharpness of the images in the photo-resist. The material reduces the losses due to defects and increases the yield of useable product.

14 Claims, 1 Drawing Sheet

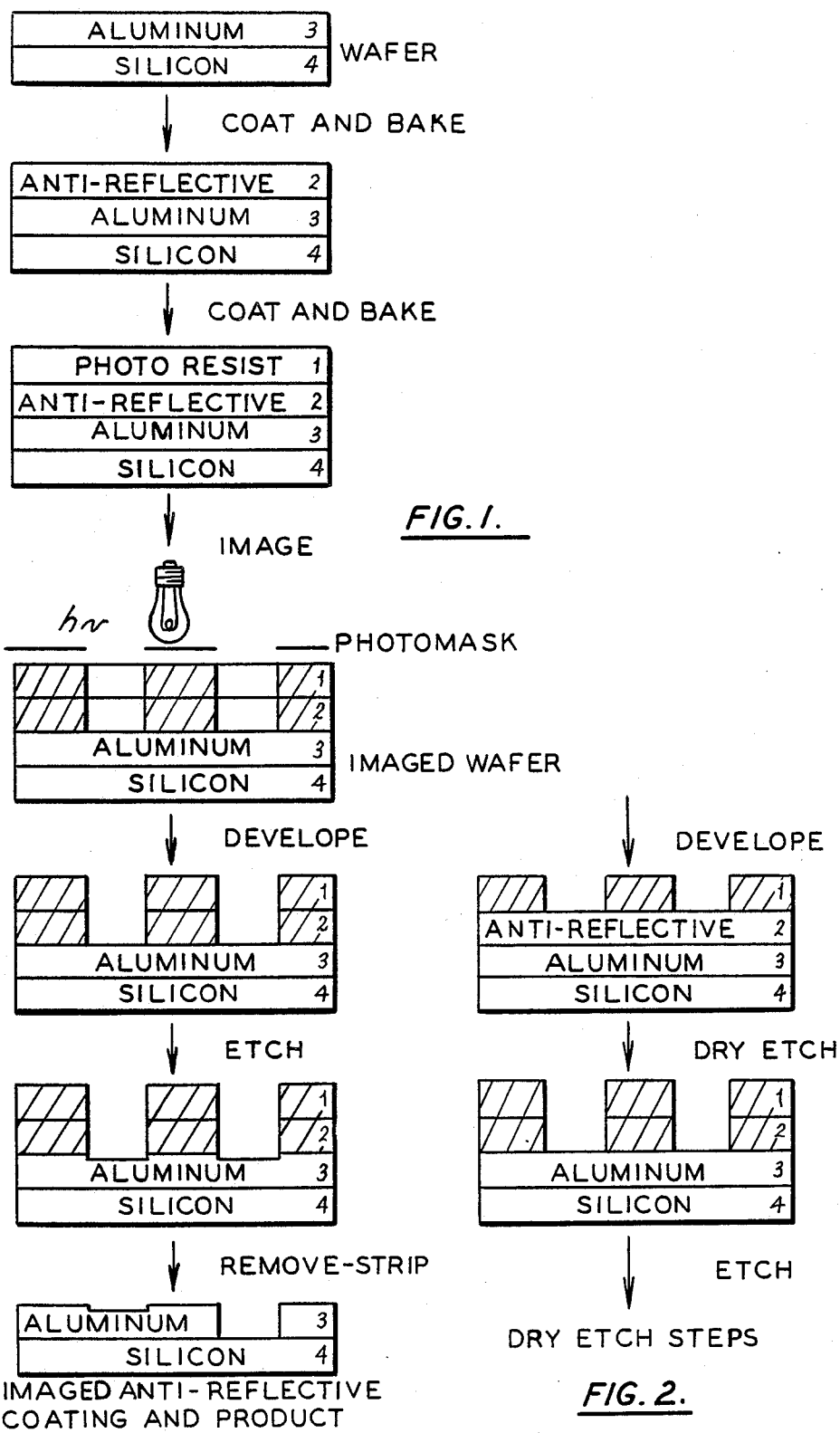

ANTI-REFLECTIVE COATING

This is a divisional of co-pending application Ser. No. 431,798 filed Sept. 30, 1982 abandoned.

BACKGROUND AND SUMMARY OF THE INVENTION

The miniaturizing of systems utilizing complex integrated circuits has required that increasingly complex circuitry be imprinted on chips of decreasing size. This reduction in size, or increase in volumetric capacity, has reached the point where the techniques available to the industry have been stretched to the limit of their capabilities. As it is, the yield of the most advanced integrated circuit chips produced by standard techniques is extremely low, on the order of 1%, due to attempts to put more and more capacity into a smaller and smaller volume. At the level of capacity which is being demanded by the industry today, the current photo-lithographic processes cannot produce a complete, workable structure more than about 1% of the time.

The problem is due in a great extent to the limitations of the photographic process used. At the microscopic level which is required, the layers of chip material, silicon, for example, are not perfectly smooth and flat. Moreover, the uneven topography is of a magnitude approximating that of the wave length of the light which is used to form the images in the photoresistive material which is applied to the layers of the chip. The light which is used to image the photoresistive material is reflected from the substrate of the chip material, that is, the silicon wafer. This reflection, coupled with the uneven topography, causes an uneven distribution of light in the imageable material and results in a large number of artifacts being produced in the developed image. These artifacts cause a large number of rejects in any semi-conductor structure built by current techniques.

It is apparent that if artifacts can be eliminated or reduced the yield of integrated circuit chips can be increased resulting in great efficiency and reducing the cost of producing such materials.

Recently there have been a number of attempts to reduce the artifacts caused by reflected light. U.S. Pat. No. 4,102,683, the disclosure of which is incorporated herein, discusses one such attempt. Other discussions appear in the *IEEE Transactions on Electron Devices*, Edition 28, No. 11 of Nov. 1981, pages 1405 through 1410, entitled "Line Width Control and Projection Lithography Using a Multi-Layer Resist Process" by O'Toole, et al. and in "Reduction of the Standing Wave Effect in Positive Photo-Resist," Brewer, et al. in *Journal of Applied Photographic Engineering*, Vol. 7, No. 6, Dec. 1981, pages 184 through 186, and "Control of One-Micron Lines in Integrated Circuits," Carlson, el al., *Kodak*, '80 Interface, Oct. 1980, pages 109 through 113.

Applicant has discovered an improved photolithographic process for integrated circuits, an improved anti-reflective material for use therein and an integrated circuit chip utilizing such material. Applicants' process uses an anti-reflective coating that eliminates deleterious effects due to internal reflections from wafer surfaces and photoresist surfaces. Applicants' material offers better adhesion, greater light absorption, is a thinner, more uniform coating, and has a more controlled development and requires fewer process steps than those previously known. Applicants' material is compatible with and images with the photoresist, in the integrated circuit manufacturing process. Applicants' coating leaves less residue on the integrated circuit wafers after development.

DESCRIPTION OF THE DRAWINGS

FIG. 1 shows a process flow for producing an integrated circuit element using an imageable anti-reflective coating.

FIG. 2 shows modified process steps using a dry etch.

DESCRIPTION OF THE PREFERRED EMBODIMENTS

Applicant uses a polymer structure, which has been modified to allow the use of common organic solvents having low surface (interfacial) energy, which can produce a firmly bonded, thin and consistent coating on a wafer surface. Suitable polymers and copolymers are polyamic acids, and equivalents, which are more soluble in solvents having low surface energy, such as alcohols, aromatic hydrocarbons, ketones and ester solvents. The polyamic acid polymers and copolymers may be polymers of toluene diamine (xylyl diamine and other aryl diamines) aliphatic diamines and aliphatic or aromatic dianhydrides with aliphatic or aromatic side groups, and the like. These materials provide more effective control over the rate of development of the anti-reflective layer, for example, because with these polymers the rate is less sensitive to variations in the bake temperature at which the coat is fixed to the wafer. The polymers, composed of these diamines, dianhydrides and equivalent materials, also coat the surfaces used in integrated circuit manufacture more uniformly with fewer defects and have better adhesion to these surfaces. The residue remaining after development from these polyimides or polyamic acids is not a problem since the residue is readily removed.

It has previously been attempted to produce anti-reflective coatings which had incorporated polymers of 4,4'-oxydianiline and benzophenone tetracarboxylic acid dianhydride and pyromellitic dianhydride, but these materials have not been effective at producing a satisfactory anti-reflective coating. The standard solvents for these polyimide precursors have large surface energies and do not penetrate into small depressions so that many areas of an integrated circuit chip are left uncoated due to the topographical variations of the substrate. The traditional solvents necessary for these previously attempted materials have been highly polar solvents, such as N-methyl pyrrolidinone, dimethyl formamide, and dimethyl sulfoxide. These solvents, which were required for dissolving the above polyamic acids, have very high surface energies, so that small depressions or troughs, commons in the surface of integrated circuit chips, are not coated. By eliminating or greatly reducing the proportion of these highly polar solvents, having such high surface energy, and exploiting a system soluble in lower surface energy solvents such as alcohols, aromatic hydrocarbons, ketones or ester solvents, the surface energy of the solution is reduced allowing the entire wafer surface to be coated and planarized. A further development in applicants' anti-reflective layer is the optional incorporation of water soluble components in the layer. These components may be, for example, polyvinyl pyrrolidinones, and equivalent polymers. The water soluble components reduce the variations in the rate of removal of the anti-reflective layer which are introduced by variations in the baking conditions, e.g. temperature.

Applicants' new material may also incorporate improved dye compounds into the reflective layer. In particular the use of the dye curcumin (color index number 75300) or equivalent derivatives, and combinations thereof, to the anti-reflective coating improves the absorption performance of the coating. These, and related, dyes absorb strongly in the region of the spectrum (436 nanometers, 405 nanometers), where the overlying photoresist is normally exposed and can be removed with the alkaline photoresist developer commonly used, e.g., because of the dye's hydroxyl groups. The combination allows rapid and consistent imaging. The dye's excellent solubility in the coating solvents and the dye's strong absorption allow very thin coatings to be used. Coatings which had been attempted, using other dyes, have not had large extinction coefficients, that is, they do not absorb as much light per dye molecule or they are not sufficiently soluble in the organic solvents used for coating, a common problem with many dyes. Due to the dye's limited solubility, not enough could be coated to absorb essentially all the reflected light and its effects, such as standing waves, were still present in the photoresist. Moreover, prior dye-vehicle combinations were not effective to produce an imageable layer, as is the applicants'. Prior attempts at producing imageable layers resulted in products which were ineffective due to defects in the coating produced, such as pinholes. The prior coatings were unreliable at imaging, had inconsistent and unreliable process characteristics, such as having narrow temperature bake latitude, and in leaving undesirable residue after processing. Attempts to accommodate these defects by use of thicker coatings were not effective. Applicants' coating is effective at imaging and does not require a thick coating or leave undesirable residue behind.

Applicants' anti-reflective coating can be made further effective by the optional additions of bixin (annatto extract) or other equivalent derivatives such as norbixin to the anti-reflective layer. Like curcumin derivatives, these dyes absorb strongly in the region of the spectrum at which the photoresist is exposed. These dyes are also readily removed by resist developer, and the carboxylic acid group and other features of these dyes decreases the variations in the rate of removal of the anti-reflective layer due to changes in the baking temperature.

Applicants' anti-reflective coating may also be produced, in a dry etchable form which also allows patterned images to be formed in the manufacturing process. In this form the vehicle that is used is rapidly removed by dry processing, that is, plasma, ion or electron beams. When the photoresist is imaged, that image is easily and rapidly transferred into the anti-reflective layer by submitting the system to a short, dry etch. In previous attempts to produce anti-reflective layers, attempts were made to use a middle layer (a third layer of a material that is not readily removed by a plasma) in order to produce a dry etch imaging. A system using two layers was also attempted, in which the photoresist was etched and entirely or mostly removed. In this second method the underlying planarizing layer does not etch fast enough to prevent the simultaneous etching of the photoresist.

Applicants' dry etchable anti-reflective coating is a relatively thick polymeric layer that planarizes the surface of the wafer and absorbs light that passes through the photo-resist. No intermediate etch resistant layer is required, because the light-absorbing planarizing layer is very rapidly removed by dry processes without significant loss of the patterned photoresist layer.

The fast etching anti-reflective layer may use the dyes described above and polymers which include copolymers of sulfur dioxide such as poly(neopentyl sulfone), polybutene-1-sulfone, halogenated polymers and copolymers such as poly (vinylidine chloride - co-vinyl acetate), poly (epichlorihydrin), chlorinated polyethylene, brominated and chlorinated polyisobutylenes, halogenated acrylates and methacrylates and copolymers, polyacetals and acetal copolymers and alpha substituted polymers such as methyl methacrylates and methylacrylonitrile, and equivalent polymers. The dyes may be any soluble dye or combination of dyes that has a suitable absorption and is easily removed by a dry process. For example, coumarins and derivatives thereof and equivalent halogenated dyes may be used and are also effective to form an imageable anti-reflective layer. The dry etch imageable anti-reflective coating adds a significant advance in geometry control without adding extra processing steps that lower yield and increase coat. The invention is compatible with photoresist materials and equipment.

Typically the dyes used by applicants are those that absorb in the wave length region of the imaging source. The dyes may be included in the anti-reflective coating at a level of from between about 1% to 20%. The film-forming vehicle, such as a polymer, maybe present at a level of between about 3% to 20%. The optional addition of water soluble materials may be in concentrations of from between about 0.1% to 10%. The appropriate wetting agents, adhesion promoters, preservatives, plasticizers, and similar additives may be incorporated at the appropriate levels, if desired, and solvent incorporated to balance the composition to 100%.

The invention may be used in processes incorporating known techniques of coating substrates, such as spinning, to produce film thickness from about 500 angstroms to 40,000 angstroms. The films may be baked at temperatures compatible with existing integrated circuit processes, for example, from about 70° C. to 200° C. The baked film may be coated and baked with a photoresist as is known in the art. The photoresist thickness may be whatever is required by the process. These layers are then exposed with light of the known required wavelengths. The films may be developed at the same time with photoresist developer for a time, for example, from about five seconds to five minutes. Or, the photoresist may be developed and the underlying film may be removed with a short plasma etch cycle, for example, in an oxygen plasma or other standard plasma process for a period of from about five seconds to five minutes. The remaining integrated circuit element process may be conducted as prescribed by the known art. The films may be removed by standard photoresist cleanup processes.

The invention will be further understood by reference to the following examples which are included for purposes of illustration from the thousands of actual experiments which have been conducted. The imaged wafers produced by applicants have been routinely examined under an electron microscope. The examinations have revealed that the standing wave effect produced by reflected light has been eliminated.

EXAMPLE 1

Using the following anti-reflection coating formulation
8.00 weight per cent poly(butene sulfone)
1.00 weight per cent Coumarin 504 (Exciton Co., Dayton, Ohio)
Cyclopentanone solvent (to balance)
a three inch aluminum-silicon wafer was coated with the anti-reflective coating, using a standard spin coating method, to an average thickness of 2.0 microns. The coated wafer was baked at 140° C. for 60 minutes to cure the coating. The coated wafer was allowed to cool and was coated with a photoresist (Shipley AZ1370) by spin coating. The photoresist was cured by baking at 95° C. for 30 minutes. The prepared wafer was imaged, using a test resolution pattern and a Cobilt contact printer. The imaged wafer was immersion developed using Shipley's MF312 developer for 20 seconds. The exposed photoresist was removed by the developer and produced a sharp, clear image. The anti-reflective layer was removed by an oxygen plasma (0.2 torr, 100 watts, 20 seconds), while the unexposed photoresist remained with almost no loss in thickness. The image was etched into the substrate of aluminum to produce a sharp pattern of an integrated circuit layer and the remaining photoresist and anti-reflective coating were removed.

EXAMPLE 2

Using the following anti-reflective coating formulation
6.00 weight % poly (butene sulfone)
1.00 weight % of the halogenated dye Coumarin 540A (Exciton Co., Dayton, Ohio)
Cyclopentanone solvent (to balance)
a three inch aluminum-silicon wafer was coated with the anti-reflective coating, using a standard spin coating method, to an average thickness of 1.5 microns. The coated wafer was baked at 140° C. for 60 minutes to cure the coating. The coated wafer was allowed to cool and was coated with a photoresist (Shipley AZ1370) by spin coating. The photoresist was cured by baking at 95° C. for 30 minutes. The prepared wafer was imaged, using a test resolution pattern and a Cobilt contact printer. The imaged wafer was immersion developed using Shipley's AZ350 developer for 20 seconds. The exposed photoresist was removed by the developer and produced a sharp, clear image. The anti-reflective layer was removed by an oxygen plasma (0.2 torr, 100 watts, 20 seconds), while the unexposed photoresist remained with almost no loss in thickness. The image was etched into the substrate of aluminum to produce a sharp pattern of an integrated circuit layer and the remaining photoresist and anti-reflective coating were then removed.

EXAMPLE 3

Using the following anti-reflective coating formulation
4.4% polyamic acid (Oxyariline and pyrromellitic dianhydride)
3.56% curcumin,
0.45% Bixin and
0.45% Sudan Orange G in 2:1 of
cyclohexanone:N-methyl-2-pyrrolidone (to balance)
a three inch silicon wafer was coated with the anti-reflective coating, using a standard spin coating method, to an average thickness of 2000 angstrom. The coated wafer was baked at 148° C. for 30 minutes to cure the coating. The coated wafer was allowed to cool and was coated with a photoresist (Shipley AZ1370) by spin coating. The photoresist was cured by baking at 90° C. for 30 minutes. The prepared wafer was imaged, using a test resolution pattern and a Cobilt contact printer. The imaged wafer was immersion developed using Shipley's MF312 developer for 10 seconds. The imaged photoresist and the anti-reflective layer were removed by the developer and produced a sharp, clear image. The developed, imaged wafer was etched into the aluminum to produce a sharp pattern of an integrated circuit layer and the remaining photoresist and anti-reflective coating.

EXAMPLE 4

Using the following anti-reflective coating formulation
5% polyamic acid (1,6 - diaminohexane and benzophenone tretracarboxylic acid dianhydride),
3.56% Curcumin,
0.45% Bixin,
0.45% Sudan Orange G in 2:1 of cyclohexanone: N-methy-2-pyrrolidone (to balance)
a three inch silicone wafer was coated with the anti-reflective coating, using a standard spin coating method, to an average thickness of 1800 angstroms. The coated wafer was baked at 148° C. for 30 minutes to cure the coating. The coated wafer was allowed to cool and was coated with a photoresist (Shipley AZ1370) by spin coating. The photoresist was cured by baking at 90° C. for 30 minutes. The prepared wafer was imaged, using a test resolution pattern and a Cobilt contact printer. The imaged wafer was immersion developed using Shipley's MF312 developer for 30 seconds. The imaged photoresist and the anti-reflective layer were removed by the developer and produced a sharp, clear image.

EXAMPLE 5

Using the following anti-reflective coating formulation
6.7% polyamic acid (Oxyaniline and pyromellitic dianhydride)
5.3% Curcumin,
1% Polyvinyl pyrrolidone in 2:1 of cyclohexanone: N-methyl-2-pyrrolidone (to balance)
a three inch aluminum-silicon wafer was coated with the anti-reflective coating, using a standard spin coating method, to an average thickness of 5000 angstroms. The coated wafer was baked at 148° C. for 30 minutes to cure the coating. The coated wafer was allowed to cool and was coated with a photoresist (Shipley AZ1370) by spin coating. The photoresist was cured by baking at 90° C. for 30 minutes. The prepared wafer was imaged, using a test resolution pattern and a Cobilt contact printer. The imaged wafer was immersion developed using Shipley's MF312 developer for 13 seconds. The imaged photoresist and the anti-reflective layer were removed by the developer and produced a sharp, clear image. The developed, imaged wafer was etched into the aluminum to produce a sharp pattern of an integrated circuit layer and the remaining photoresist and anti-reflective coating were removed.

EXAMPLE 6

Using the following anti-reflective coating formulation
5% polyamic acid (2,4-diamino toluene and benzophenone tetracarboxylic acid dianhydride)

3.56% curcumin,
0.45% Bixin,
0.45% Sudan Orange G in 2:1 of cyclohexanone: N-methy-2-pyrrolidone (to balance)
a three inch aluminum-silicon wafer was coated with the anti-reflective coating, using a standard spin coating method, to an average thickness of 2000 angstroms. The coated wafer was baked at 160° C. for 30 minutes to cure the coating. The coated wafer was allowed to cool and was coated with a photoresist (Shipley AZ1370) by spin coating. The photoresist was cured by baking at 90° C. for 30 minutes. The prepared wafer was imaged, using a test resolution pattern and a Cobilt contact printer. The imaged wafer was immersion developed using Shipley's MF312 developer for 13 seconds. The imaged photoresist and the anti-reflective layer were removed by the developer and produced a sharp, clear image. The developed, imaged wafer was etched into the aluminum to produce a sharp pattern of an integrated circuit layer and the remaining photoresist and anti-reflective coating were removed.

EXAMPLE 7

Using the following anti-reflective coating formulation
5% Polyamic acid (2,4-diaminotoluene and benzophenone tetracarboxylic acid dianhydride),
0.45% Bixin,
0.45% Sudan Orange G in 2:1 of cyclohexanone: N-methy-2-pyrrolidone (to balance)
a three inch silicon wafer was coated with the anti-reflective coating, using a standard spin coating method, to an average thickness of 2000 angstroms. The coated wafer was baked at 165° C. for 30 minutes to cure the coating. The coated wafer was allowed to cool and was coated with a photoresist (Shipley AZ1370) by spin coating. The photoresist was cured by baking at 90° C. for 30 minutes. The prepared wafer was imaged, using a test resolution pattern and a Cobilt contact printer. The imaged wafer was immersion developed using Shipley's MF312 developer for 20 seconds. The imaged photoresist and the anti-reflective layer were removed by the developer and produced a sharp, clear image.

It will be appreciated by those skilled in the art that variations in the invention disclosed herein may be made without departing from the spirit of the invention. The invention is not to be limited by the specific embodiments disclosed herein, but only by the scope of the claims appended hereto.

We claim:

1. In a process of making integrated circuit elements by photolithography the improvement comprising, applying a light absorbing, imageable, anti-reflective coating to an integrated circuit element substrate and overcoating the substrate and anti-reflective coating with a photoresist, subsequently imaging a pattern in the photoresist and anti-reflective coating layers, the anti-reflective layer imaging with the photoresist, developing and removing the developed image from the photoresist and anti-reflective coating layers, the imaged anti-reflective layer developing with and being removed with the photoresist, and etching a pattern defined by the imaged photoresist and anti-reflective coating layers into the substrate to produce an integrated circuit element, the anti-reflective coating having a dye and vehicle combination effective to reproducably form a tightly bonded, uniform, anti-reflective coating and a sharp, substantially completely removable image on the substrate and being effective at the wave length of the exposing light to substantially eliminate the effect of reflected light and produce clear, sharply defined etched structures in the substrate.

2. The method of claim 1, wherein the photoresist and anti-reflective layer are simultaneously imaged.

3. The method of claim 1, wherein the photoresist and anti-reflective layer are developed simultaneously.

4. The method of claim 1, wherein the anti-reflective coating layer is a thin, uniform layer.

5. The method of claim 1, wherein the anti-reflective coating layer is effective to substantially eliminate the standing wave effect of reflected light.

6. The process of claim 1, wherein the anti-reflective coating comprises a dye and vehicle combination in a solvent, the combination being effective, when applied to an integrated circuit element, of producing a tightly bonded, uniform, anti-reflective coating, and when coated with a photoresist and exposed to light of a wave-length sufficient to image the photoresist, being effective to produce a sharp, substantially completely removable image on the substrate, the anti-reflective coating being developable and removable with the photoresist and when developed and removed from the substrate being effective to substantially eliminate the effect of reflected light and producing clear, sharply defined images in the substrate.

7. The process of claim 6 wherein the solvent is selected from one or more of the group consisting of alcohols, aromatic hydrocarbons, ketones and ester solvents having a low surface (interfacial) energy, and combinations thereof.

8. The process of claim 6 wherein the coating material is a wet etchable coating material having a solvent selected from one or more of the group consisting of alcohols, aromatic hydrocarbons, ketones, and ester solvents having a low surface (interfacial) energy, and combinations thereof, wherein the vehicle is selected from one or more of the group consisting of polymers and copolymers of polyamic acids which are readily soluble in the solvent, and combinations of the polyamic acid polymers and copolymers with water soluble polymers and copolymers, and wherein the dye is selected from one or more of the group consisting of curcumin and its derivatives and bixin and its derivatives, the anti-reflective coating material being effective to produce a thin, uniform, tightly bonded coating substantially free of defects over an integrated circuit substrate and the like having an uneven surface topography of dimensions approximating that of the wavelength of the exposing light used in the attendant photolithographic process.

9. In a process of making integrated circuit elements by photolithography the improvement comprising applying a light absorbing anti-reflective coating to an integrated circuit element substrate, the anti-reflective coating having a vehicle selected from the group consisting of plasma degradable polymers and copolymers of sulfur dioxide, and overcoating the anti-reflective coating with an adjacent photoresist layer, subsequently imaging a pattern in the photoresist, developing the imaged pattern and removing the developed photoresist, and dry etching the imaged pattern into the anti-reflective coating layer and the substrate to produce an integrated circuit element.

10. The method of claim 9 wherein the image is transferred to the anti-reflective layer by dry etching the developed imaged pattern and the pattern is subsequently etched into the substrate.

11. In a process of making integrated circuit elements by photolithography the improvement comprising, applying a light absorbing, imageable, anti-reflective coating to an element substrate, overcoating the substrate anti-reflective coating with a photoresist, and producing an etched integrated circuit element from the coated substrate by photolithography, the anti-reflective coating simultaneously imaging with the photoresist and having a dye and vehicle combination effective to reproducably form a tightly bonded, uniform coating and a sharp, substantially completely removable image on the substrate and being effective at the wave length of the exposing light to substantially eliminate reflected light and produce clear, sharply defined etched structures in the substrate.

12. In a process of making integrated circuit elements by photolithography, the improvement comprising, applying a light absorbing, imageable, anti-reflective coating to an element substrate and overcoating the substrate and anti-reflective coating with a photoresist, subsequently imaging a pattern in the photoresist and the anti-reflective coating layers, simultaneously developing the imaged anti-reflective and photoresist layers, etching a pattern defined by the imaged photoresist and anti-reflective coating into the substrate and removing the photoresist and anti-reflective coating layers to produce an integrated circuit element, the anti-reflective coating having a dye and vehicle combination effective to reproducably form a tightly bonded, uniform coating and a sharp, substantially completely removable image on the substrate and being effective at the wave length of the exposing light to substantially eliminate reflected light and produce clear, sharply defined etched structures in the substrate.

13. In a process of making integrated circuit elements by photolithography the improvement comprising, applying a thin layer of a light absorbing, imagable, anti-reflective coating to an element substrate, overcoating the substrate and anti-reflective coating with a photoresist, and producing an etched integrated circuit element from the coated substrate by photolithography, the anti-reflective coating having a dye and vehicle combination in a solvent, the combination being effective, when applied to a integrated circuit element, to reproducably form a thin, tightly bonded, uniform coating layer over a substrate surface typography of a magnitude approximating that of the wave length of the light used in the photolithographic process, the coating being effective when exposed to light of a wave length sufficient to image the photoresist, of producing a sharp, substantially completely removable image on the substrate and when developed and removed from the substrate being effective to substantially eliminate the standing wave effect of reflected light and produce clear, sharply defined etched structures in the substrate, the dye being selected from one or more of the group consisting of curcumin and its derivatives and bixin and its derivatives and combinations thereof.

14. In a process of making integrated circuit elements by photolithography the improvement comprising, applying a thin layer of a light absorbing, imagable, anti-reflective coating to an element substrate, overcoating the substrate and anti-reflective coating with a photoresist, and producing an etched integrated circuit element from the coated substrate by photolithography, the anti-reflective coating having a dye and vehicle combination in a solvent, the combination being effective, when applied to a integrated circuit element, to reproducably form a thin, tightly bonded, uniform coating layer over a substrate surface typography of a magnitude approximating that of the wave length of the light used in the photolithographic process, the coating being effective when exposed to light of a wave length sufficient to image the photoresist, of producing a sharp, substantially completely removable image on the substrate and when developed and removed from the substrate being effective to substantially eliminate the standing wave effect of reflected light and produce clear, sharply defined etched structures in the substrate, the vehicle being selected from one or more of the group consisting of readily soluble polymers and copolymers of polyamic acids and combinations thereof with water soluble polymers and copolymers.

* * * * *